(12) United States Patent
Zur (10) Patent No.: US 6,275,040 B1
(45) Date of Patent: Aug. 14, 2001

(54) DESIGNING SPECTRAL-SPATIAL PULSES (76) Inventor: Yuval Zur, 35 Ider Street, 34752, Haifa (IL)

(*) Notice: Subject to any disclaimer, the term of this patent is extended or adjusted under 35 U.S.C. 154(b) by 0 days.

(21) Appl. No.: 09/313,413

(22) Filed: May 18, 1999

(51) Int. Cl.[7] .................................................. G01V 3/00
(52) U.S. Cl. ............................................................ 324/320
(58) Field of Search .................................... 324/320, 307, 324/309

(56) References Cited

U.S. PATENT DOCUMENTS 5,150,053 * 9/1992 Pauly et al. ........................... 324/309
5,233,298 * 8/1993 Dumoulin ............................. 324/306
5,446,384 * 8/1995 Dumoulin ............................. 324/307

OTHER PUBLICATIONS

Schick, F.; "Simultaneous Highly Selective MR Water and Fat Imaging Using a Simple New Type of Spectral–Spatial Excitation"; Magnetic Resonance in Medicine; vol. 40; pp. 194–202; 1998.

Meyer, Craig H. et al.; "Simultaneous Spatial and Spectral Selective Excitation"; Magnetic Resonance in Medicine; vol. 15; pp. 287–304; 1990.

Hore, P. J.; "Solvent Suppression in Fourier Transform Nuclear Magnetic Resonance"; Journal of Magnetic Resonance; vol. 55; pp. 283–300; 1983.

Man Lai–Chee et al.; "Improved Automatic Off–Resonance Correction Without a Field Map in Spiral Imaging"; Magnetic Resonance in Medicine; vol. 37; pp. 906–913; 1997.

Man Lai–Chee et al.; "Multifrequency Interpolation for Fast Off–Resonance Correction"; Magnetic Resonance in Medicine; vol. 37; pp. 785–792; 1997.

Zur, Yuval; "Design of Improved Spectral–Spatial Pulses With Positive and Negative Slice Select Gradient Lobes"; Elscint MR Inc.; Jan. 9, 1998.

Purdy, David E. et al.; "Improved Multi–Slice Fat Suppression in Inhomogenus Fields Using Variable–Frequency Spectral–Spatial Water Excitation Pulses"; Siemens Medical Systems; pp. 653; 1995.

Forster, J. et al.; "Spectral–Spatial Excitation and Saturation in Multi–Slice Imaging"; University of Tübingen; pp. 1461; Germany; 1996.

Harvey, Paul R. et al.; "Fat Free Angiography Using Flow Compensated Binomial–Spectral–Spatial–Slice-Variable–Tip–Angle RF Slice Selection"; Elscint MRI Centre; Israel; 1997.

Fredrickson, Jill O. et al.; "Flow Effects of Spectral Spatial Excitation"; Stanford University; 1997.

Pauly, J. et al.; "A Linear Class of Large–Tip–Angle Selective Excitation Pulses"; Journal of Magnetic Resonance; vol. 82; pp. 571–587; 1989.

Block, W. et al.; "Consistent Fat Suppression with Compensated Spectral–Spatial Pulses"; Magnetic Resonance in Medicine; vol. 38; pp. 198–206.

Conolly, S. et al.; "A Reduced Power Selective Adiabatic Spin–Echo Pulse Sequence"; Magnetic Resonance in Medicine; vol. 18; pp. 28–38; 1991.

Reeder, S. B. et al.; "Referenceless Interleaved Echo–Planar Imaging"; Magnetic Resonance in Medicine; vol. 41; pp. 87–94; 1999.

* cited by examiner

Primary Examiner—Christine Oda
Assistant Examiner—Dixomara Vargas
(74) Attorney, Agent, or Firm—Cowan, Liebowitz & Latman, P.C.; William H. Dippert (57) ABSTRACT

A method of selective excitation of a first spectral band in the presence of a second spectral band whose magnetization vector is not to be affected, comprising:
  selecting a central synthesizer frequency of substantially the second spectral band;
  applying a spectral-spatial pulse, centered on the selected synthesizer frequency to selectively excite the first spectral band. Preferably, the spectral-spatial pulse is a type II spectral-spatial pulse having odd and even pulse trains.

17 Claims, 9 Drawing Sheets

DESIGNING SPECTRAL-SPATIAL PULSES

FIELD OF THE INVENTION

The present invention relates to designing and applying spectral-spatial pulses for magnetic resonance imaging.

BACKGROUND OF THE INVENTION

Frequency selective pulses are well known in the art. One type of frequency selective pulses is a standard volume (non-spectral-spatial) pulse for fat saturation, which is applied non-spatially selective to an entire image volume, for example by applying a narrow-band pulse without a slice selection gradient. Another type of frequency selective pulse is a spectral-spatial pulse, which is used to selectively excite spins at a spatial location z and a spectral frequency $\upsilon$. A particular important application of frequency selective pulses is selective imaging of water-based tissue in the presence of fat-based tissue. In this application, it is desirable that, over a very small frequency range (e.g., the difference between the frequency bands of fat and water), there be a high contrast between excited and non-excited tissue types. One technique is to selectively saturate the fat tissue, so that when the entire region is excited, the fat, which is pre-saturated, will not become excited and will not generate a significant signal. Another technique is to selectively excite the water tissue so that only it generates a signal.

A benefit of spectral-spatial pulses is that they are relatively immune to the effects of magnetic field inhomogenity, especially those caused by changes in magnetic susceptibility. In human body imaging, there are many susceptibility changes between image slices, so a spectral-spatial pulse, which can be adapted separately for each slice, is inherently better than a volume saturation pulse for exciting only a specific frequency range.

Another advantage is reduced cross-talk between fat and water magnetization. In an imaging procedure when n slices are imaged, a volume fat saturation pulse may be applied as many as "n" times, for each TR (the time between repeated successive excitations of the same slice), thus, the entire volume is "saturated" n times. If the saturation is not exact, for example due to field inhomogenities, some of the water may also be excited or saturated. In contrast, the spectral-spatial pulse saturates a particular portion only once every TR, thus, any adverse magnetization effects, which are signal, do not accumulate and/or they decay in time.

It should be noted that the "fat" frequency is typically broad, in many cases, there is even a significant overlap between the broad fat band and the narrow water band. Thus, any frequency shift caused by inhomogenity is quite likely to move the target frequency of the pulse and saturate the water signal by mistake (in a fat saturation pulse) or excite the fat (in a a selective water excitation pulse).

Spectral-spatial excitation pulses are used, for example in short TR Gradient echo imaging. A Fat saturation pulse applies a large tip angle very often. Thus, even a small frequency shift (due to field inhomogenity) can unintentionally saturate the nearby frequency band of water. On the other hand, the small tip angle for water excitation will not usually cause a significant amount of fat signal, even if the field is a little inhomogeneous.

A spectral-spatial pulse comprises a train of sub-pulses, the train being applied in synchrony with an oscillating slice selection gradient. Each sub-pulse acts only on the slice at a location z by the slice selection gradient, while the accumulation of phase along the train results in the saturation for a particular frequency $\nu$. More precisely, the end-magnetization comprises a series of magnetization lobes in $\nu$ separated by $1/\tau$ Hz, where $\tau$ is the delay between adjacent sub-pulses. The width of the slice s determined by the slice selection gradient. In selective fat/water suppression/excitation, the fat-water frequency separation is matched to the spectral-spatial pulse such that one of the frequencies of water and fat are inside a magnetization lobe and the other is outside a magnetization lobe.

As indicated above, a spectral-spatial pulse may be used to excite (saturate) an off-center slice portion. If the applied gradient is G(t), the frequency shift of the slice is $\gamma G(t) z_i$, where $z_i$ is the slice location. Thus, the applied frequency f(t) is $f(t) = \gamma G(t) z_i + \nu_0$. A spin with frequency $\nu_1$ can be excited (saturated) by setting $\nu_0 = \nu_1$.

An excitation pulse excites a desired set of spins to achieve an $M_{xy}$ magnetization vector. Saturation works by achieving an $M_z$ magnetization vector. The advantage of some excitation pulses is that they can be used to apply small tip angles, which pulses are less likely to excite undesirable tissue (with other frequencies). A disadvantage of excitation pulses is that a spectral-spatial excitation pulse is longer than a non-frequency selective excitation, so that it affects the TE in short TE sequences. These sequences are thus made more sensitive to patient movement and field inhomogeneity. A saturation pulse does not affect the TE, since it is applied before the pulse, so longer pulses with a sharper transition can be used. For example, saturation pulses are used with spin echo (SE) and fast spin echo FSE) sequences. However, the saturation pulse is sensitive to RF field inhomogenity. Variations in $B_1$ change the tip angle and cause the saturation to be incomplete.

Figure 1A:
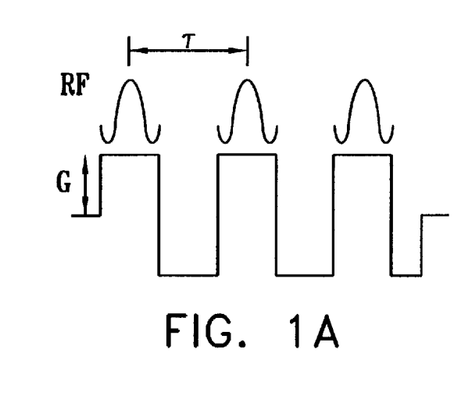
FIGS. 1A and 1B illustrate a type I spectral-spatial pulse.
Figure 1B:
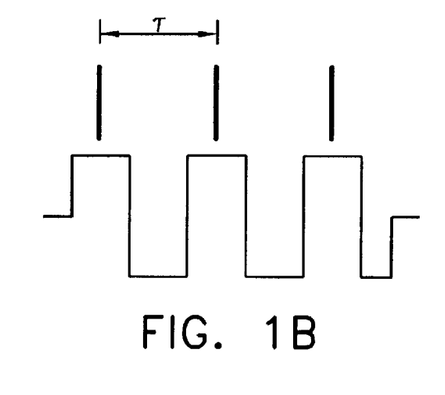
Figure 1C:
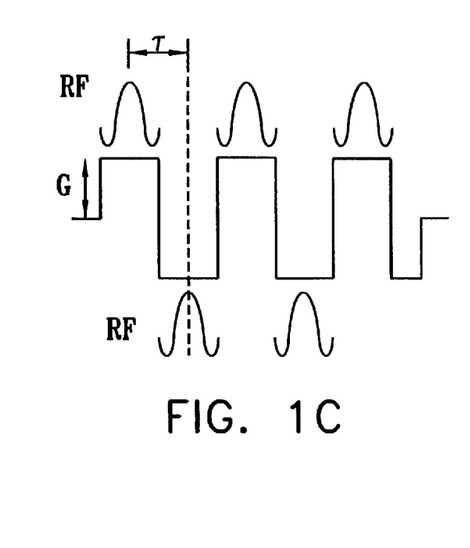
FIGS. 1C and 1D illustrate a type II spectral-spatial pulse.
Figure 1D:
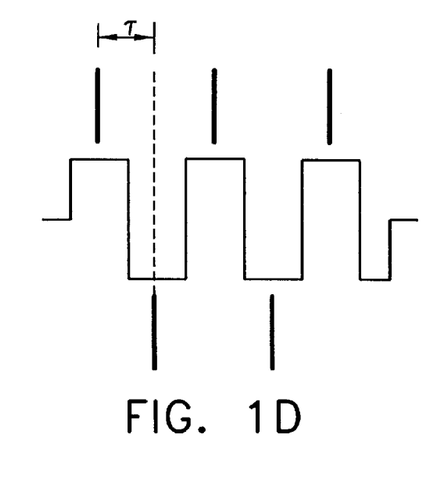

Spectral-spatial pulses are usually classified as type I or as type II pulses. FIGS. 1A and 1B show a type I pulse, in which RF sub-pulses are applied (with a spacing$\tau$) only during one polarity of the oscillating gradient. FIGS. 1C and 1D show a type II pulse in which RF sub-pulses are applied during both polarities of the gradient field. If $\gamma G \Delta z \gg \Delta \nu$, where $\gamma G \Delta z$ is the frequency bandwidth along the z axis and $\Delta \nu$ is the frequency bandwidth along $\nu$, the pulse sequence of FIG. 1A (and FIG. 1C) can be considered equivalent to that of FIG. 1B (and FIG. 1D), in which inherently refocused sub-pulses arc replaced by delta-type sub-pulses at spacing $\tau$, for example as described in "A Linear Class of Large Tip-Angle Selective Excitation Pulses", by J. Patly, D. Nishirura and A. Macovski in *J. Mag. Res.* Vol. 82 pp. 571–587 (1989), the disclosure of which is incorporated herein by reference.

As noted above, it is desirable for one of frequencies of the two differentiated tissues (fat, water) to be in a magnetization lobe and for the other one to be outside a magnetization lobe. The locations of the magnetization lobes are very sensitive to field variations, so the two frequencies are usually positioned so one is in the middle of a lobe and one is in the center area between the lobe and an adjacent lobe. This means that $\frac{1}{2}\tau \geq \Delta \nu_{wf}$. The fat-water separation increases with the field strength, so a smaller $\tau$ is required in higher field strengths to obtain a same quality of fat water separation. However, the slice thickness also constrains $\tau$. The slice thickness ($\Delta z$) and the time-bandwidth (TB) product are determined by $\gamma S = TB/\Delta z$, where S is the effective area of the gradient during the sub-pulse, $$S = \int_0^{TRF} G(u)du$$

and TRF is the duration of the RF pulse. In type I pulses, TRF is about equal to τ/2, since there is no RF over half of the gradient (the negative part). In type II pulses, TRF is about equal to τ. Thus, S for type II pulses can be about three times as large as for a type I pulse using same maximnum gradient amplitudes and slew rates. Consequently, the slice width of a type II pulse can be about ⅓ the width of a comparable type I pulse. This is a requirement in high-field MRI, in which minimum slices widths are desired, even as the fat-water frequency separation increases.

Figure 2:
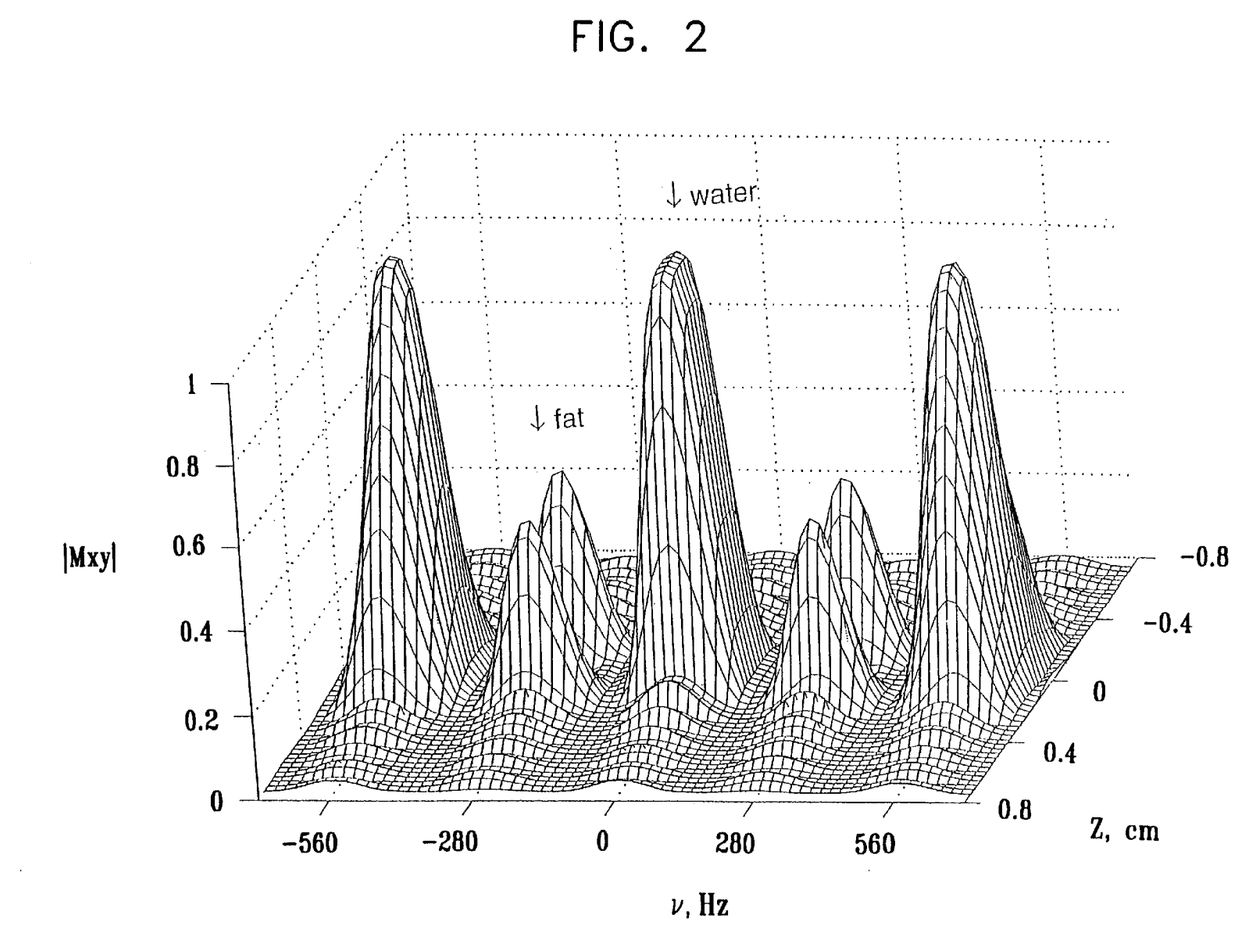
FIG. 2 illustrates an $M_{xy}$ magnetization profile of a prior art selective water excitation pulse.

A limitation of type II spectral-spatial pulses is that they have many magnetization lobes. FIG. 2 illustrates the $M_{xy}$ magnetization profile of a prior art type II selective water excitation pulse. However, this pulse is not useful for fat-water separation, since both the fat and the water fall on magnetization lobes and both are excited. It is noted that in this example the water frequency falls on an even lobe and the fat falls on an odd lobe. These lobes have a different behavior, for example, the transverse magnetization ($M_{xy}$) of the odd lobe is antisymmetric in the z direction (not shown in the figure which is an amplitude rendition). In one known method, this anti-symmetric behavior is assumed to provide a zero average fat excitation across the slice, with the signal from fat tissue in one half of the slice being canceled by the signal in the other half of the slice, which has an opposite phase.

"Consistent Fat Suppression with Compensated Spectral-Spatial Pulses", by W. Block, J. Pauly, A. Kerr and D. Nishimura, in *Mag. Res. Med.*, Vol. 38, pp. 198–206, the disclosure of which is incorporated herein by reference, describes a method of canceling the effect of magnetization lobes in a type II pulse. The same scan is run twice, once with a gradient function G and once with a gradient function -G. The even magnetization lobes are the same for both data sets. However, the odd magnetization lobes have an opposite polarity in the two sets. Thus, when the data from the two data sets is added together the effect of the odd magnetization lobes, e.g. the fat signal, is subtracted out. However, this method cannot be used for saturation pulses, since saturation is not signed like excitation. Also, two excitations are required, so this pulse sequence is applied over a longer period of time than a type II pulse. In addition, this sequence is more sensitive to patient motion. Another method with similar disadvantages is described in "Simultaneous Highly Selective MR Water and Fat Imaging Using a Simple New Type of Spectral-Spatial Excitation, by F. Schick, in *Mag. Res. Med.*, Vol. 40, pp. 194–202 (1998), the disclosure of which is incorporated herein by reference.

SUMMARY OF THE INVENITON

An object of some preferred embodiments of the invention is to provide improved methods of designing and/or applying spectral spatial pulses, especially type II spectral-spatial pulses.

An aspect of some preferred embodiments of the invention relates to independently controlling characteristics of odd and even magnetization lobes generated by a type II spectral-spatial pulse. In a preferred embodiment of the invention, the amplitude of odd lobes is controlled independently of the amplitude of even lobes, by shifting all the lobes along the synthesizer frequency axis. In a preferred embodiment of file invention, the shifting of the lobes causes one of the odd lobes to approximately coincide with the center synthesizer frequency. The odd lobes are found to be dependent on their off-center frequency and thus achieve an approximately zero amplitude at the center frequency. In a preferred embodiment of the invention, only a single magnetization lobe is canceled at or about a fat/water boundary or another type of frequency selection boundary. In a preferred embodiment of the invention, the lobe translation is achieved by adding a phase shift between each adjacent sub-pulses.

An aspect of some preferred embodiments of the invention relates to using a spectral-spatial pulse for frequency-selective excitation. In a preferred embodiment of the invention, the center frequency is set on tissue which is not to be excited, and the tissue to be excited (e.g., water) is excited by a non-central lobe. In a preferred embodiment of the invention a type II spectral-spatial pulse is used and the amplitude of the magnetization lobe at the center frequency is maintained at zero by forcing an odd magnetization lobe, rather than an even magnetization lobe, to coincide with the center frequency. Alternatively, a type I spectral-spatial pulse is used, in which there is no odd magnetization lobe. In a preferred embodiment of the invention, the forcing of an odd magnetization lobe to be at the center frequency is achieved by translating both odd and even lobes along the frequency axis. Preferably, the amount of translation is such that tissue to be excited coincides with a magnetization lobe, for example a nearest even magnetization lobe. Preferably, this translation is achieved by adding a phase shift between adjacent sub-pulses. Alternatively to excitation, a shifted pulse may be used for selective saturation.

An aspect of some preferred embodiments of the invention relates to reducing image artifacts caused by type I and/or type II spectral-spatial pulses. In a preferred embodiment of the invention, the effect of eddy currents is reduced by applying one or more dummy gradients prior to commencing with RF radiation. Thus, eddy currents, caused by the gradient application, reach a steady state. In a preferred embodiment of the invention, at least two dummy gradients are applied. Preferably, these dummy gradients are applied as part of a type I or a type II spectral-spatial pulse. Alternatively or additionally, these dummy gradients are applied as part of a calibration sequence for a spectral-spatial pulse.

An aspect of some preferred embodiments of the invention relates to reducing image artifacts caused by type II spatial-spatial pulses, especially those directed to non-central slice locations. In a preferred embodiment of the invention, one or more adverse effects caused by a distortion of the actually applied gradients, as compared to the ideal gradients, are corrected for by adding a phase shift between adjacent sub-pulses instead of or in addition to directly correcting the distortion. Alternatively or additionally, the distortion whose adverse effects are being corrected for is a mismatch between the gradient response of multiple gradient coils which coils are applied to select an oblique slice. In a preferred embodiment of the invention, the distortion is caused by a mismatch between effective gradient application and a synthesizer used to select a phase and/or frequency for applying the RF pulses.

In a preferred embodiment of the invention, a calibration sequence is applied to determine an effective phase shift of the RF relative to the spins being irradiated, which effective phase shift is caused by system imperfections, e.g., eddy currents and delays in feedback circuits for powering gradients. The determined phase shift is used to calculate a correcting phase shift to be added to the applied pulse, to correct the one or more adverse effects of imperfections. In a preferred embodiment of the invention, different phase shifts are determined for different volumes, for example, to provide a different phase shift per image slice. In a preferred embodiment of the invention, an iterative process is used in which the phase is fed back into the calibration process until the determined error is small enough.

Alternatively to a calibration scan, the required corrective phase shift may be determined by calculation. In the case of multiple gradient misalignment, the different methods of correction determination may be mixed, e.g., the corrections applied may be combinations of pre-scan and calculation, only pre-scan or only calculation.

An aspect of some preferred embodiments of the invention relates to spectral-spatial pulse design. In a preferred embodiment of the invention, minimum phase equi-ripple FIR filters are used for designing spectral-spatial saturation pulses and their constituent sub-pulses. In a preferred embodiment of the invention, the resulting sub-pulse is time inverted, for use in negative-gradient sub-pulse trains, to correct for a reverse direction of advance in k-space during the negative gradient. Alternatively or additionally, the RF is resampled using a VERSE process to allow the RF to be applied also when the gradient is not at a constant amplitude. Preferably, the inverse SLR process is applied on the unevenly sampled results of the VERSE sequence, by interpolating between them, preferably using a Fourier interpolation There is thus provided in accordance with a preferred embodiment of the invention, a method of selective excitation of a first spectral band in the presence of a second spectral band whose magnetization vector is not to be affected, comprising:

selecting a central synthesizer frequency of substantially the second spectral band;

applying a spectral-spatial pulse, centered on the selected synthesizer frequency to selectively excite the first spectral band. Preferably, said spectral-spatial pulse comprises a type II spectral-spatial pulse having odd and even pulse trains. Alternatively, said spectral-spatial pulse comprises a type I spectral-spatial pulse.

In a preferred embodiment of the invention, applying a pulse comprises adding a phase shift between said odd pulses and said even pulses to translate a magnetization lobe of said pulse. Alternatively or additionally, translating said lobe causes said lobe to have a substantially zero magnetization amplitude at said synthesizer frequency.

In a preferred embodiment of the invention, said excitation adds a tip angle of over 90° to spins in said first spectral band. Alternatively, said excitation adds a tip angle of under 40° to spins in said first spectral band.

In a preferred embodiment of the invention, said pulse is a selective excitation pulse. Alternatively, said pulse is a selective saturation pulse.

In a preferred embodiment of the invention, the method comprises acquiring data responsive to said excitation and generating a spatial image using said acquired data.

There is also provided in accordance with a preferred embodiment of the invention, a method of affecting magnetization vectors in magnetic resonance, comprising:

providing a type II spectral-spatial pulse having odd and even magnetization lobes; and modifying at least one parameter of said pulse to independently control a characteristic of said odd lobes with respect to said even magnetization lobes, wherein said at least one parameters includes at least one relative phase shift of between at least two individual sub-pulses of said pulse. Preferably, said characteristic comprises an amplitude of said lobes. Alternatively or additionally, modifying comprises modifying said at least one parameter to reduce the amplitude of a particular magnetization lobe. Alternatively or additionally, said at least one parameter comprises a phase shift between each pair of adjacent sub-pulses. Preferably, a same phase shift is added between said sub-pulses. Alternatively or additionally, an alternating polarity phase shift is added between said sub-pulses.

In a preferred embodiment of the invention, said phase shift is approximately pi radians. Alternatively, said phase shift is determined responsive to a ratio between a described spectral separation and an interval between sub-pulses in said pulse.

There is also provided in accordance with a preferred embodiment of the invention, a method of reducing data acquisition artifacts in a spectral-spatial pulse, comprising:

applying at least one gradient pulse without a corresponding RF pulse; and applying a series of gradient pulses with corresponding RF pulses of said spectral-spatial pulse. Preferably, said at least one pulse comprises at least two pulses. Alternatively or additionally, said spectral-spatial pulse comprises a type I spectral-spatial pulse. Alternatively, said spectral-spatial pulse comprises a type II spectral-spatial pulse.

In a preferred embodiment of the invention, said pulse comprises an imaging pulse. Alternatively, said pulse comprises a part of a calibration sequence.

In a preferred embodiment of the invention, a number of said at least one gradient pulse is determined responsive to eddy currents in a system in which the spectral-spatial pulse is applied.

There is also provided in accordance with a preferred embodiment of the invention, a method of correcting adverse effects caused by gradient distortions in the application of a spectral-spatial pulse, comprising:

determining a phase-shifting effect of said distortion; and alternately adding and subtracting said phase shift between adjacent sub-pulses of said pulse. Preferably, said distortion is caused by eddy currents. Alternatively or additionally, said distortion effects a phase shift between a synthesizer of an MRI system used for applying said pulse and spins which are to be affected by said pulse. Alternatively or additionally, said phase shift is dependent on an off-center position for which said pulse is designated. Alternatively or additionally, said alternatively adding and subtracting said phase shifts comprises phase shifting a system synthesizer used for generating said pulses. Alternatively, said alternatively adding and subtracting said phase shifts comprises adding and subtracting a phase shift relative to a fixed system synthesizer used for generating said pulses.

In a preferred embodiment of the invention, determining comprises calibrating using a phantom and later determining said phase shift for an object based on results of said calibration. Alternatively or additionally, determining comprises performing a pre-scan on an object to be imaged, to measured the effect of said phase shift.

In a preferred embodiment of the invention, a plurality of gradient coil axes are used for spatial selection. Preferably, phase-shifting effects are determined using both calibration using a phantom and pre-scanning an object.

In a preferred embodiment of the invention, the method comprises acquiring data responsive to said pulse and generating a spatial image using said acquired data.

There is also provided in accordance with a preferred embodiment of the invention, a method of determining an effective phase shift in a type II spectral-spatial pulse, comprising:

applying at least one sub-pulse of a spectral spatial pulse; and analyzing a phase shifting effect occurring to said sub-pulse. Preferably, said applying comprises applying two sub-pulses, one with a positive polarity and one with a negative polarity and adding the phase effects of said pulses to determine a total phase shifting effect. Alternatively or additionally, the method comprises repeating said applying and said analyzing for a plurality of off-center slice locations to determine a position dependent phase-shifting effect.

There is also provided in accordance with a preferred embodiment of the invention, a method of spectral-spatial pulse design, comprising:

selecting a minimum phase equi-ripple filter for said pulse;

applying a VERSE method to sub-pulses of said pulse; and time inverting odd sub-pulses of said pulse. Optionally, the method comprises applying an inverse SLR transform to said time inverted and VERSE modified sub-pulses.

BRIEF DESCRIPTION OF THE DRAWINGS

The invention will be more clearly understood by reference to the following description of preferred embodiments thereof in conjunction with the figures, wherein identical structures, elements or parts which appear in more than one figure are labeled with the same numeral in all the figures in which they appear, in which.

DETAILED DESCRIPTION OF PREFERRED EMBODIMENTS

A type II spectral-spatial pulse can be analyzed as a sum of the effect of two pulses, a positive pulse train series which is applied during positive polarity (odd) gradients and a negative pulse train series which is applied during negative polarity (even) gradients. The positive pulse train can be represented as $A\{\alpha_i^o\}$, where $\alpha_i^o$ are the tip angles of each sub pulse and A is a scaling factor. Similarly, the negative pulse train can be represented by $B\{\alpha_i^e\}$ where $\alpha_i^e$ are the tip angles of the negative pulses. The derivation of scaling factors A and B is described below.

For a spin at a location (z, v) in a rotating frequency frame centered on $v_0$, i.e., at a z off-center location and at a v off-center frequency, the precession frequency of the spin is given by $$\begin{cases} f_p(z, v) = \gamma Gz + v \\ f_n(z, v) = -\gamma Gz + v \end{cases} \quad (1)$$

where $f_p$ and $f_n$ are the precession frequencies for the positive and negative gradient polarities respectively.

Figure 3:
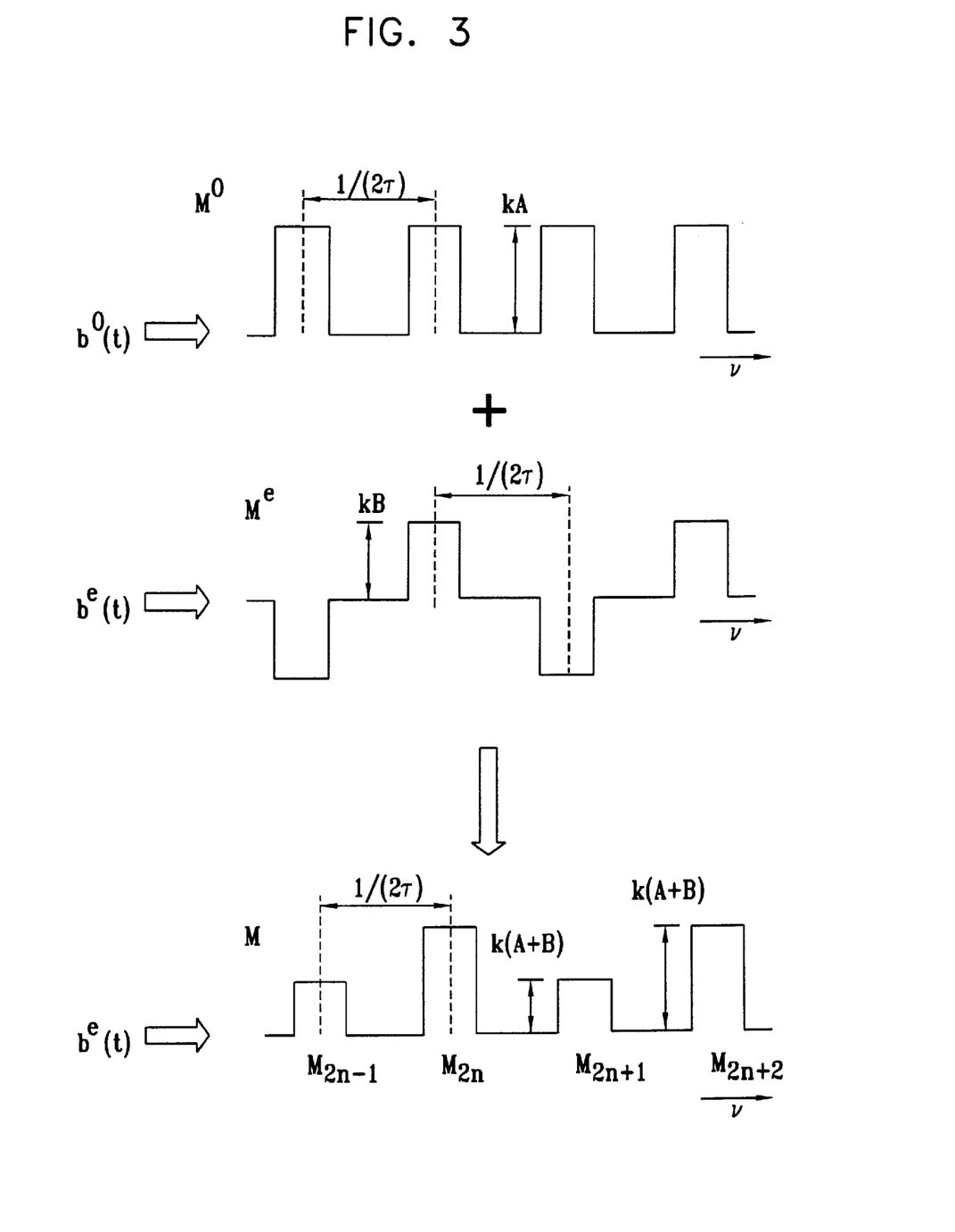
FIG. 3 schematically illustrates how the magnetization lobes of a type II pulse are derived from a sum of the magnetization lobes caused by the positive and negative gradient RF signals.

FIG. 3 illustrates how the magnetization lobes of a type II excitation pulse are derived from a sum of the magnetization lobes effected by RF sub-pulses applied during the positive and negative gradients of an excitation pulse. $M^o$ denotes the magnetization lobes caused by the positive gradient sub-pulse train $b^o(t)$ and $M^e$ indicates the magnetization lobes caused by the negative gradient sub-pulse train $b^e(t)$, which lobes have alternating positive and negative phases. M denotes the complete magnetization effect of the type II pulse. The magnetization lobes are denoted by $M_{2n}$ (even) and $M_{2n+1}$ (odd) with n=0, ±1, ±2 . . . It should be noted that odd lobes have an amplitude proportional to A−B and even lobes have an amplitude proportional to A+B. The frequency offset between odd lobes and even lobes is $1/(2\tau)$.

Referring back to equation (1), for a spin ($v_1$, $z_1$), $f_p=\gamma Gz_1+v_1$ and $f_n=-\gamma Gz_1+v_1$. For a spin at ($-v_1,z_1$), $f_p=\gamma Gz_1-v_1$ and $f_n=-\gamma Gz_1-v_1$. Thus, $$f_p(v_1)=-f_n(-v_1). \quad (2)$$

Scaling factors A and B are proportional to the Fourier transform of a sub-pulse at a frequency f. RF sub-pulses applied during negative gradients are preferably time-inverted with respect to RF pulses applied during positive gradients. Thus, scaling factor A of the odd tip angles at a precession frequency f is equal to scaling factor B of the even tip angles at precession frequency −f:

$$A(f)=B(-f), \quad (3)$$

In the general case however, A can be different from B and the odd tip angles can be different from the even tip angles, depending on the pulse design.

From equations (2) and (3), it can be concluded that the amplitudes of the even and the odd lobes of a spin at ($z_1, -v_1$) are B |A and B−A respectively. Thus, for every given z, the amplitudes of the even lobes are symmetric with respect to v=0 and the amplitudes of the odd lobes are anti-symmetric. Also, for a given $v=v_1$, the amplitudes of the even lobes are symmetric with respect to z and the amplitudes of the odd lobes are anti-symmetric with respect to z.

As a result of this anti-symmetric behavior of the odd lobes, it can be shown that $M_{2n+1}(z,v)=-M_{-(2n+1)}(z,-v)$ and $=-M_{2n+1}(-z,v)$. Thus, odd lobes must have a zero amplitude for all z values, if v=0.

In another way of viewing the situation, the odd lobes are generated for a frequency v because of the mismatch between the positive and the negative paths in k-space. Thus, the odd lobe is smaller if |v| is smaller, and is zero at v=0.

However, it is noted that an even lobe $M_0$ is generated at $v=0$. Another result of the anti-symmetry of odd magnetization lobes is that odd lobes must have a zero amplitude for all frequencies $v$ if $z=0$.

Figure 4A:
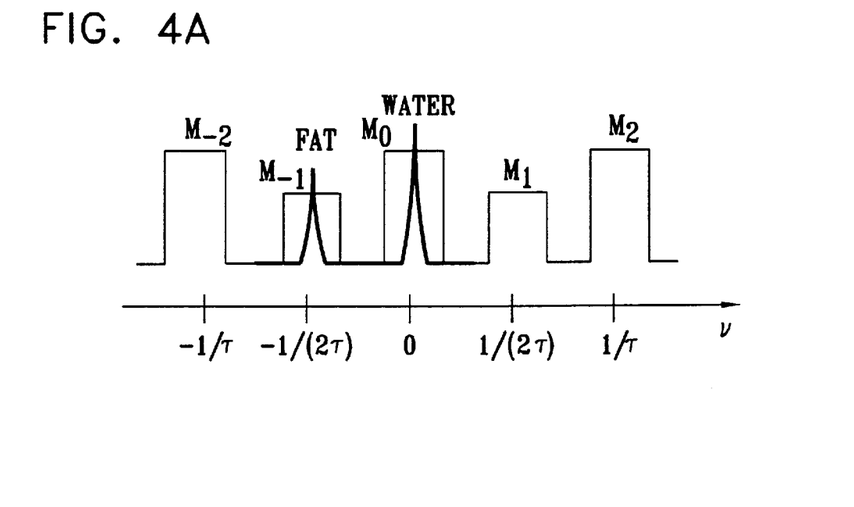
FIGS. 4A–4C illustrate a method of lobe cancellation, in accordance with a preferred embodiment of the invention.

FIG. 4A shows a magnetization profile of a prior art type II selective water excitation pulse. The center frequency $v$ is centered on the water frequency to be excited. However, due to the small fat-water separation and due to the existence of odd magnetization lobes, the fat frequency also coincides with a magnetization lobe, so there is less of a selective excitation.

Figure 4B:
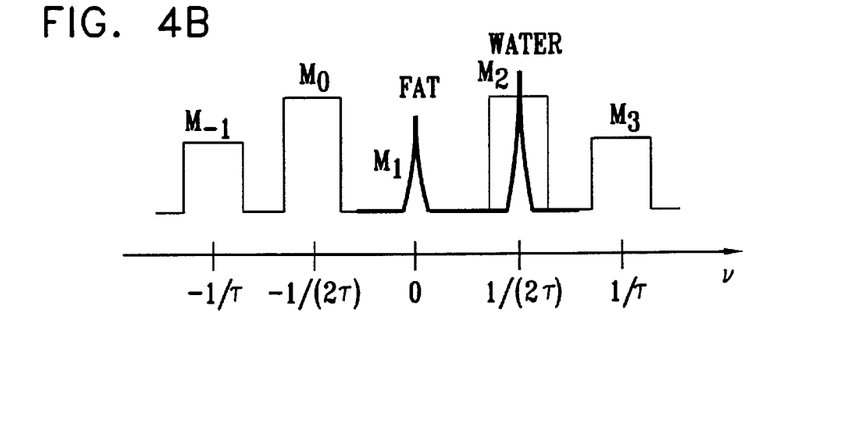

In a preferred embodiment of the invention, an odd lobe is canceled by translating that odd lobe (preferably using a method described below) towards the synthesizer frequency, so that its amplitude is reduced (to zero at the exact frequency). In a preferred embodiment of the invention, all the lobes are translated as a unit, so that the even lobe $M_0$ is translated away from the synthesizer frequency. Thus, there will be no excitation at the synthesizer frequency. In a preferred embodiment of the invention, the center frequency is chosen to be that of tissue which is not to be excited, for example fat, and $\tau$ is selected so that the tissue to be excited coincides with a magnetization lobe. FIGS. 4B demonstrates this selection, whereby odd lobe M1 is centered on frequency $v$, coincides with the fat frequency and has a zero amplitude and the water frequency coincides with lobe $M_2$, which has a none-zero amplitude. It is noted that the term "translation" is not precise, as the amplitudes of at least some of the odd lobes are affected by the translation.

In a preferred embodiment of the invention, the odd and even lobes are translated by ½τ, so that the odd lobe will coincide with the center frequency $v_0$ rather than the even lobe. In a preferred embodiment of the invention, the translation is achieved by adding a phase shift of π radians between adjacent sub-pulses. The present inventor has determined that by adding a particular phase shift between adjacent pulses, the position of the lobes relative to the synthesizer frequency can be controlled. Typically, by design, the center of the even magnetization lobe $M_0$ sits at a frequency where the phase between consecutively applied sub-pulses is zero. When a positive phase is added between sub-pulses the frequency where there is zero phase between the sub-pulses is shifted to a lower frequency such that the added phase is canceled. This causes all the lobes to be shifted by the same frequency shift.

The method of adding the phase shift can preferably depends on the MRI system used For example, in some systems, such a phase shift is added by adding a phase shift of the transmitted RF relative to the synthesizer. In other systems, the phase shift is modified by directly controlling the synthesizer phase.

Figure 5:
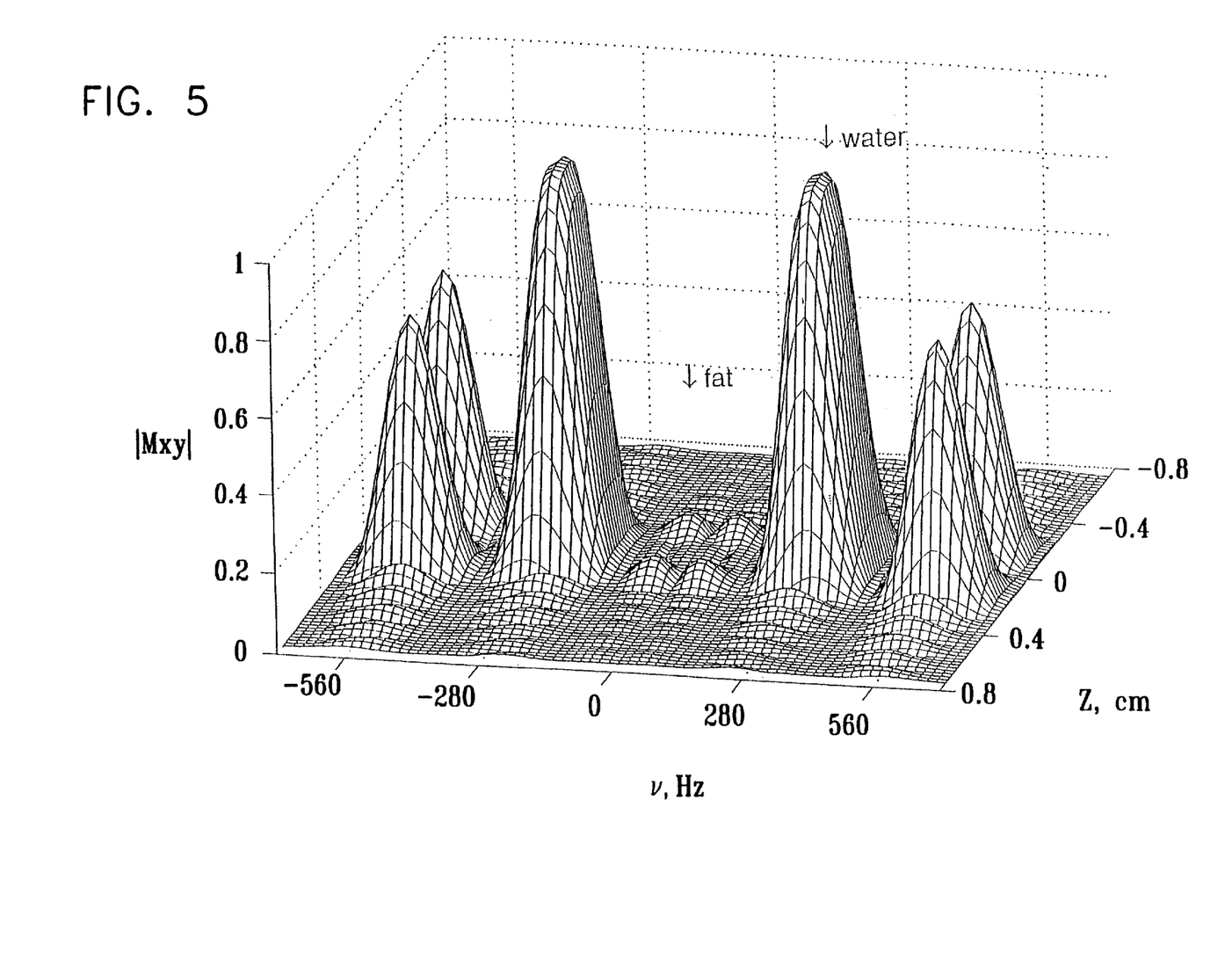
FIG. 5 illustrates an $M_{xy}$ magnetization profile of a selective water excitation pulse, in accordance with a preferred embodiment of the invention.

FIG. 5 illustrates an $M_{xy}$ magnetization profile of a selective water excitation pulse as described above with reference to FIG. 4B. The pulse parameters are described below.

Figure 4C:
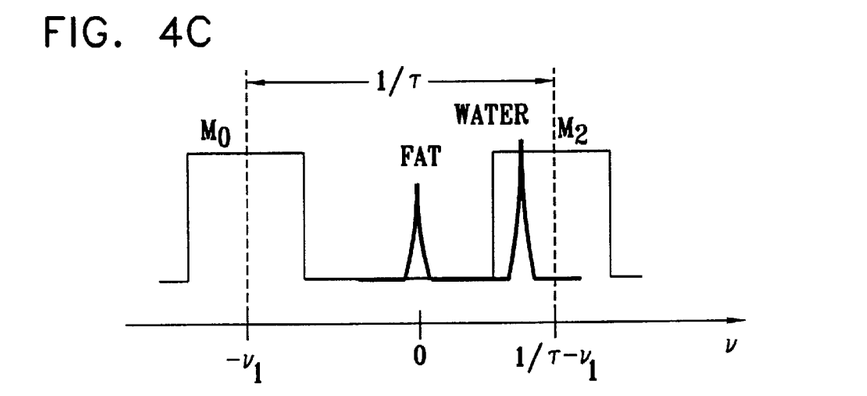

In some cases, the fat/water separation will be smaller than ½τ. In such a case it may be desirable to translate the magnetization lobes by less than ½τ. FIG. 4C illustrates such a case, where the center synthesizer frequency is chosen to be that of fit and an even lobe ($M_2$ in this case) is positioned to be within the fat/water separation from $v_0$, so that water will be excited. As shown in the figure, neither the fat frequency nor the water frequency is required to be exactly centered with respect to magnetization lobes, however, such centering typically allows a maximum stability of the fat-water separation in the presence of field inhomogeneities which shift the lobes. In a preferred embodiment of the invention, such a translation is achieved by adding phase values other than π. For example, a translation of $v_1$ Hz can be achieved by adding a phase of $-2\pi v_1 \tau$ between adjacent sub-pulses, where $v_1$ is determined so that the frequency to be excited coincides with a magnetization lobe.

The above analysis of the symmetry and zeroing of magnetization lobes applied also to saturation pulses. Thus, in a preferred embodiment of the invention, a fat-saturation pulse is designed so that the frequency to be saturated is not the central frequency. The central frequency coincides with an odd lobe, which has a zero amplitude and, thus, substantially no saturation effect. The translation of the magnetization lobes is determined so that one (or more) of them coincides with the frequency(s) to be saturated.

Figure 6:
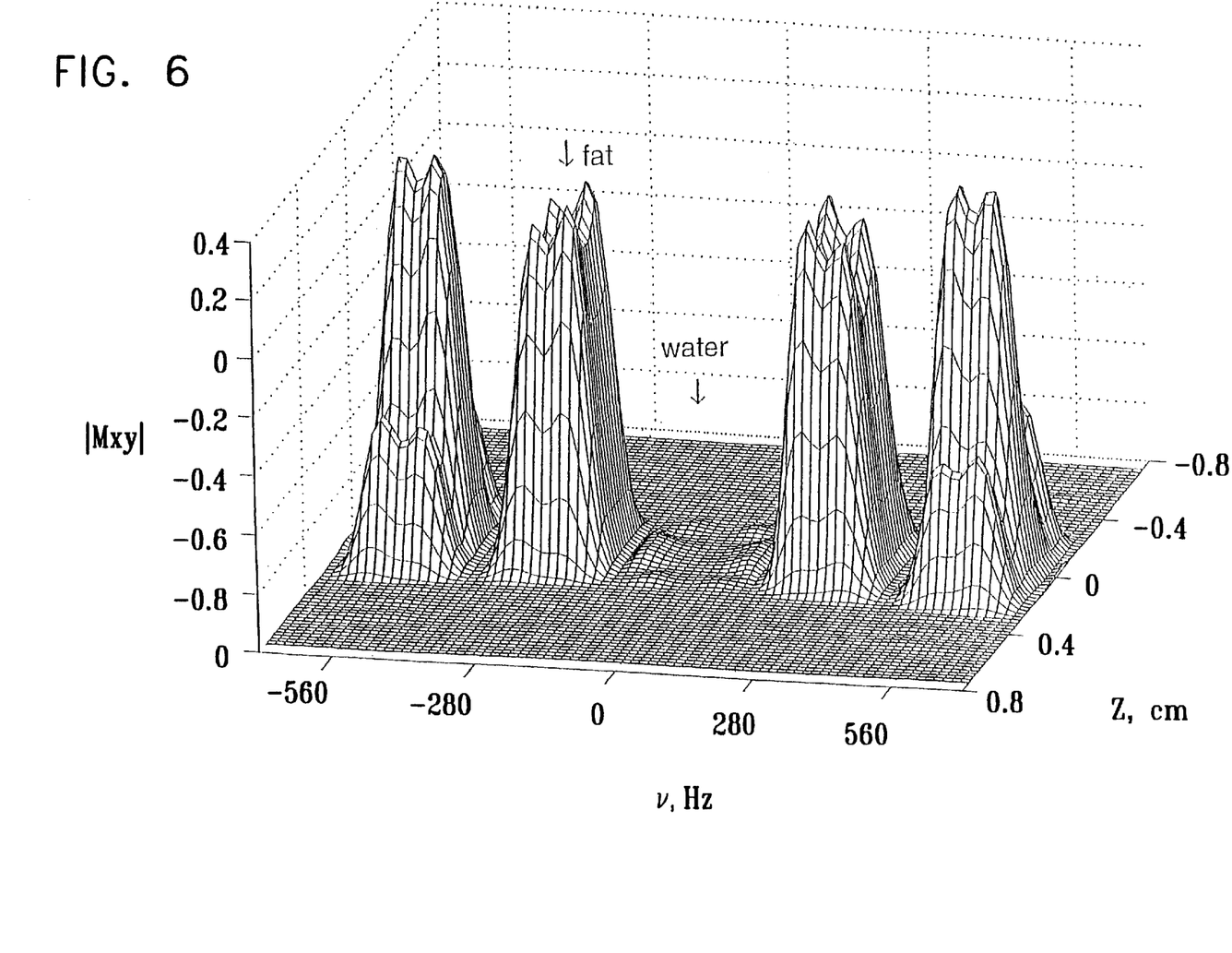
FIG. 6 illustrates an $M_z$ magnetization profile of a selective fat saturation pulse, in accordance with a preferred embodiment of the invention.

FIG. 6 illustrates an $M_z$ magnetization profile of a selective fat saturation pulse, in accordance with a preferred embodiment of the invention. The pulse parameters are described below.

It should be noted that unlike other type II pulses, a pulse in accordance with a preferred embodiment of the invention includes a non-excited region of width $1/v$ between the two magnetization lobes bracketing $v=0$, instead of only regions of at most width ½τ. Thus, all the advantages of type II pulses can be enjoyed, while still naintaining (at least one) wide separation between lobes. Thus, type II pulses can be applied with a greater leeway for error. In the example of FIG. 5, the effect of a small mistake in setting the center frequency will only cause a reduction in the water excitation amplitude and will not cause a corresponding increase in fat excitation. Further, this leeway can be used to design the pulse to selectively affect one or two different frequencies in the presence of a third or more different spectral frequencies or to use magnetization lobes which are not adjacent to the center frequency.

Several practical issue are preferable addressed when designing a spectral-spatial pulse in accordance with a preferred embodiment of the invention. In a typical design process, the N $\{\alpha_i\}$ tip angles are calculated by approximating a desired spectrum in $v$ with a finite impulse response (FIR) filter of N points and then applying an inverse SLR transform to determine the tip angles $\{\alpha_i\}$. In some cases, the inverse SLR is required to be performed on non-evenly spaced sample points, for example, after VERSE-modifying a minimum phase filter. In a preferred embodiment of the invention, the samples are interpolated, for example using a Fourier interpolation method.

Figure 7A:
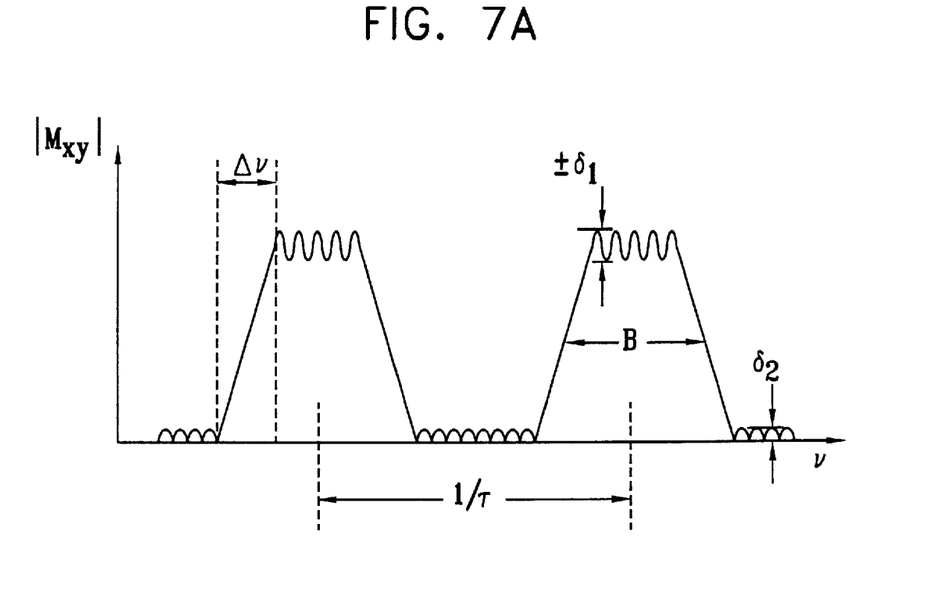
FIGS. 7A and 7B illustrate transition width and ripple properties for an excitation pulse and a saturation pulse, respectively, in accordance with a preferred embodiment of the invention.
Figure 7B:
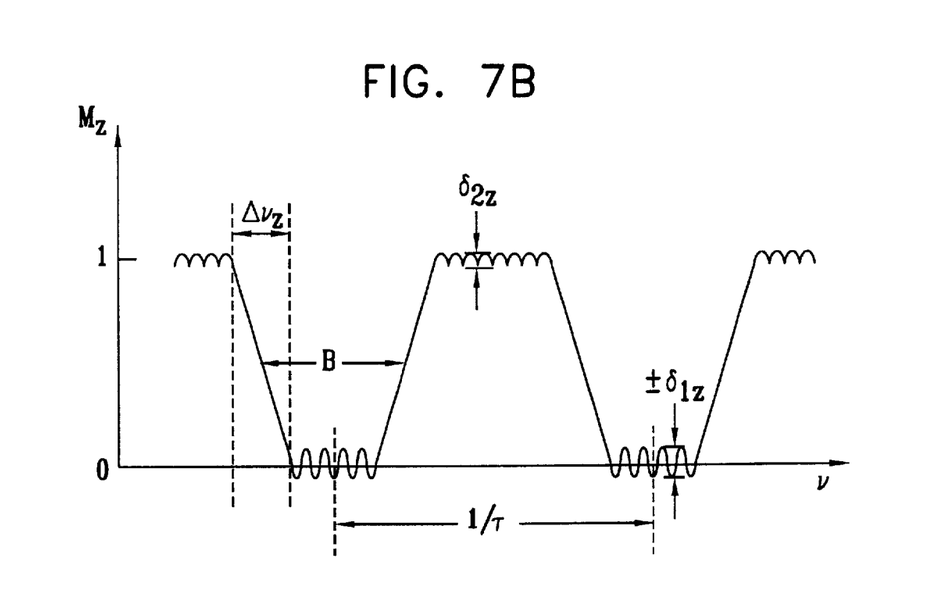

FIG. 7A is a schematic of a profile of a frequency-dependent magnetization effect of an excitation pulse, ie., the spectrum of the pulse. The pass band bandwidth is denoted as B. There is a finite transition, width $\Delta v$ from the stop band to the pass band. In addition, there are ripples of amplitude $\delta 1$ in the pass band and of amplitude $\delta 2$ in the stop band. In an ideal filter, $\Delta v$, $\delta 1$ and $\delta 2$ are all zero. Desirably, a best approximation of an ideal filter is found by minimizing $\Delta v$, $\delta 1$ and $\delta 2$. In a real FIR filter with a given $\delta 1$ and $\delta 2$, the transition width $\Delta v$ is proportional to $1/T$, where T is the pulse duration: $T=N\tau$. In a preferred embodiment of the invention, a constant ripple FIR filter is used. The narrower the transition, the better the spectral resolution and/or the immunity against field variations due to main field inhomogenity and/or susceptibility. The amplitude of the ripples is usually only important in imaging applications if they are above 1:5, in spectroscopy applications a ratio of 1:300 may be desired, possibly requiring the use of a different FIR. FIG. 7B shows a magnetization profile for a saturation pulse.

In a preferred embodiment of the invention, an excitation pulse uses a linear phase constant ripple filter. In a preferred embodiment of the invention, a saturation pulse uses a minimum phase constant ripple filter. The minimum phase filter allows narrower transitions than the linear phase filter, however, the linear phase filter is linear in v and allows the use of a refocusing pulse.

In a preferred embodiment of the invention, a VERSE method, for example as described in "A Reduced Power Selective Adiabatic Spin-Echo Pulse Sequence" by S. Conolly, G. Glover, D. Nishimura and A. Macovski, in *Mag. Res. Med.* Vol. 18, pp. 28–38 (1991), the disclosure of which is incorporated herein by reference, is used for RF pulse design, so that RF sub-pulses can be applied also during rise and fall of the gradients and not only during their flat top. In the VERSE Method, the RF pulse is resampled and re-weighted to match a non-constant gradient. Generally, the resampling requires stretching the pulse portions which correspond to lower gradients, so that the effective area S of the pulse is equal to that of a non-stretched pulse portion for a constant, peak, gradient. For some gradient wave forms, the stretching is non-linear.

In a preferred embodiment of the invention, the negative polarity RF sub-pulses are inverted in time relative to the positive polarity RF pulses, because the k-space trajectory is inverted by the opposite field polarity. This is especially relevant for the minimum phase filter which is significantly asymmetric in time.

In one example, the pulse parameters of the excitation pulse which generates the profile of FIG. 5 are 1.9T (fat-water separation =280 Hz), $\beta 1$ and $\beta 2$ are 0.005 and 0.015 respectively (for a linear phase FIR filter), the bandwidth is 150 Hz, N=8 and $\tau$=1.8 msec. Each sub-pulse is a sinc sub-pulse with a time bandwidth product of 3.0. The minimum slicewidth is 29 mm.

In another example, the pulse parameters of the saturation pulse which generates the profile of FIG. 6 are 1.9T (fat-water separation =280 Hz), $\beta 1$ and $\beta 2$ are 0.06 and 0.003 respectively (for a minimum phase filter), the bandwidth is 170 Hz, N=8, $\tau$=1.8 msec and the tip angle $\alpha$=110°. For each sub-pulse a (second) minimum phase FIR filter with in-slice/out-of-slice ripples of 0.05/0.005 is used, to ensure sharp slice profile. The time bandwidth product for the sub-pulses is 3.6. In other pulses, other types of second FIR filters may be applied As described above, a phase shift may be added between adjacent sub-pulses in order to translate the magnetization lobes in a desirable manner. Unfortunately, an undesirable translation may be caused by field variations, caused for example by imperfections in the systems, possibly resulting in excitation of tissue which was not supposed to be excited or vice versa. In typical MRI systems, the gradients are not directly controlled. Instead, a feedback circuit is used to drive the gradient coils. The delay between the control of the circuit and the response of the gradient coils is neither zero nor exactly known. Further, in order to reduce feedback effects, various filters are used in the feedback circuits, which filters further affect the output of the gradient coils. In addition, eddy currents, induced by the gradients can add an additional offset to the applied gradients. As a result, the actually applied gradients are not the same as those for which the pulse was designed. It should be noted that spectral-spatial pulses are often applied at the highest slew rates achievable by the MRI system at which high slow rates the system is not entirely controllable. The RF is usually controllable to a higher degree than the gradients. The application of the RF is typically synchronized to a synthesizer. This synchronization includes both temporal synchronization and phase synchronization. Thus, the phase of the RF is typically locked (or phased shifted relative to) the phase of the synthesizer frequency.

Figure 8:
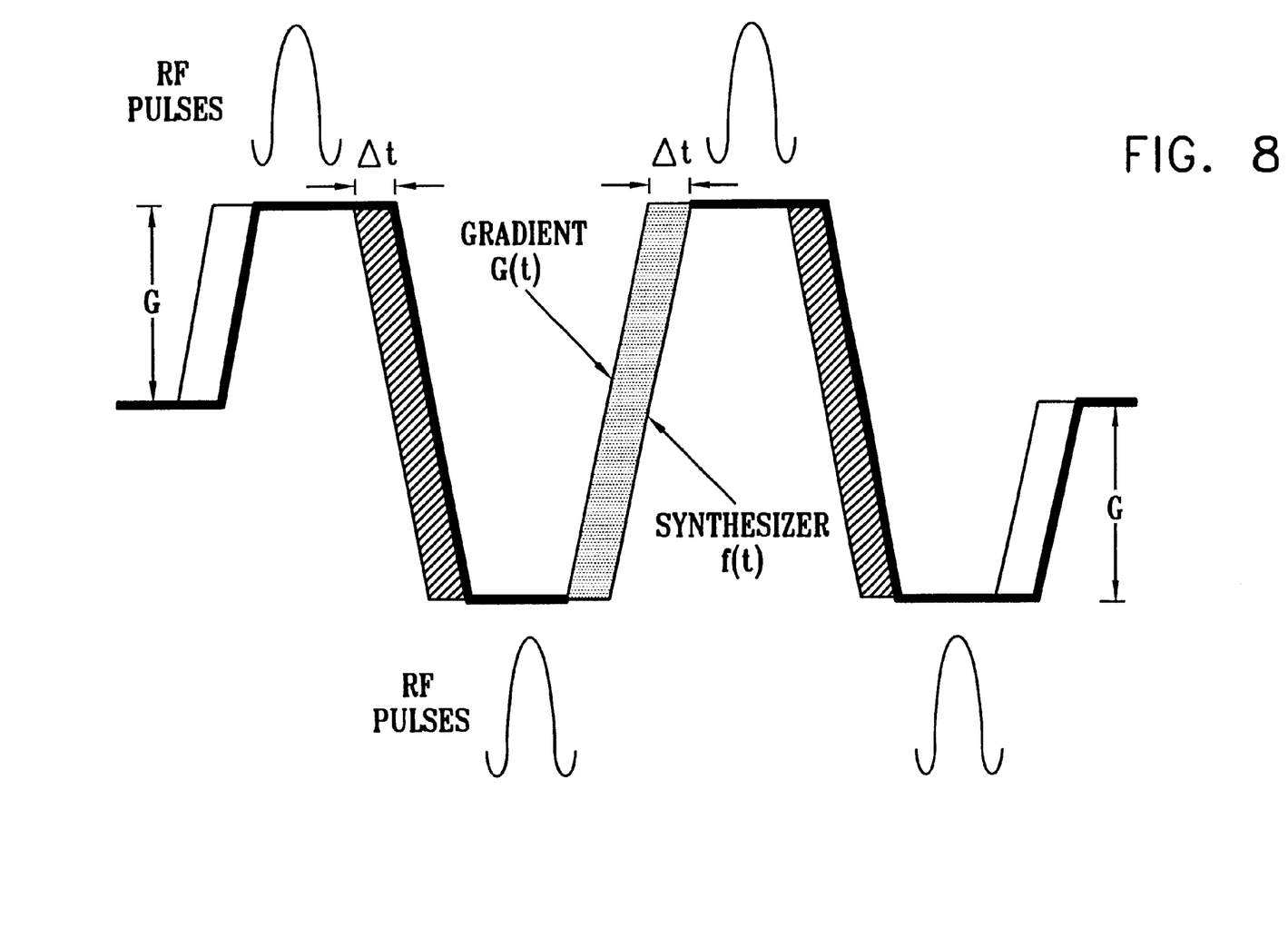
FIG. 8 illustrates the effect of mismatch between gradient application and RF application in a spectral spatial pulse.

The gradient output can be distorted in several ways. A significant source of error can be modeled as an effective delay of the gradient application. Similar correction methods to those described below can be applied to correct the error from other distortions caused by the imperfections. FIG. 8 shows the effect of a small $\Delta t$ in the timing of the gradients. As will be shown below, even a small $\Delta t$ of 1 microsecond can significantly degrade the outcome of a spectral-spatial pulse. There are two types of effect. A first effect is that, as the gradient of the affected spin is larger, the precession rate in the rotating frame is faster, causing a greater phase difference between the affected spin and the applied RF. This effect is caused by the phase of the RF not matching the phase of the spins. As the z distance is greater, the frequency difference between the spins in the of-center slice and the synthesizer frequency is also greater, so a same distortion is equivalent to a greater phase shin in the affected spins. A second effect is "constant" over the entire imaged region and is caused by position independent eddy currents. The effects for spins at a z location $Z_i$ can be summed as:

$$\psi(t) = \gamma z_i \int_0^t \Delta G(t')dt' + \gamma \int_0^t \Delta B_0(t')dt' \qquad (4)$$

where $\Delta B_0$ are the variations in the effective $B_0$ (main field), caused for example by eddy current induced fields and $\Delta G$ is the deviation between the ideal gradient demand and the actual gradient output.

In FIG. 8, the gradient delay $\Delta t$ between f(t), which follows the ideal gradient demand and the actual gradient output adds a phase shift $\psi_0$ of $2\gamma z_i G \Delta t$ during the gradient fall between an odd and an adjacent even sub-pulse, where G is the peak amplitude of the gradient. This affected area is equal to the dotted area in FIG. 8. A same type of area is also can also be generated by other types of distortions. However, a phase shift of $-\psi_0$ is generated during the gradient raise. Thus, for a type I pulse, the two phase shifts cancel each other out, resulting in a zero phase shift between two adjacent odd or even sub-pulses. However, for a type II pulse, the effect of this phase shift accumulates and causes a shifting of the amplitude of magnetization between odd lobes and even lobes.

The effect of the phase shift is to create new lobes at offsets of ½τ. An important lobes which is created is a new lobe at v=0. The phase shift is equivalent to multiplying the even tip angles by $\exp(i\psi 0)$ relative to the even tip angles. The effect of this phase shift is analogous to the effect of the inherent phase shift between odd and even tip angles (where a factor B was added or subtracted from the amplitude of magnetization, depending on the lobe number and the phase shift) except tat this effect is position independent, so there are no anti-symmetric effects. Thus, the ratio between the magnetization of an odd lobe and an even lobe $M_{2n+1}/M_{2n}$= $(1-\exp(i\psi_0))/(1+\exp(i\psi 0))$. This relationship means that the phase shift causes part of the magnetization to shift between odd lobes and even lobes.

The consequences of the magnetization shift can then be determined. If, for example, we require $M_1/M_0<5\%$ then we need $\psi_0<0.1$ radian to avoid a too large magnetization shift to the new lobe formed at v=0. Referring back to equation (4), $\psi_0=2\gamma z_i G \Delta t$. $\Delta t$ can be minimized by advancing the gradient application so that it is synchronized with the synthesizer. However, for G=19 mT/m and $z_i$=10 cm we require $\Delta t<0.1$ microsecond. Such a level of precision may be difficult to achieve.

There are several types of eddy currents, including currents having a time constant smaller than $\tau$, about similar to $\tau$ and those having a time constant greater than. The long-decay eddy currents are usually compensated for in MRI systems. In addition, these eddy currents typically have a small effect on the outcome of the pulse. So, in some preferred embodiments of the invention, these eddy current are ignored. The effect of short duration eddy-currents (time factor significantly smaller than $\tau$) is usually a same effective phase shift (with an opposite sign for the rise and the fall), which treated as described above.

In a preferred embodiment of the invention, one, two or more dummy gradients are applied prior to applying the RF pulse, so that eddy currents having a time constant of about $\tau$ reach a steady state of behavior. Preferably, if the length of the dummy gradients is about two times that of the eddy current time constant, the phase shift alternates between $+\psi$ and $-\psi$ (as with the short duration eddy currents) Thus, at least in a type I pulse, the rising and filling phase shifts can cancel each other out. In a preferred embodiment of the invention, the eddy currents having a time constant of about $\tau$, are determined using any of the methods known in the art. Then, a simulation is performed to determine the number of dummy gradient required to achieve a steady state. Typically however these eddy currents are already compensated for in well-calibrated MRI systems.

In a preferred embodiment of the invention, the erroneous phase shift is corrected by adding phase shifts between adjacent sub-pulses to undo the effects of gradient misapplication, instead of or in addition to directly correcting the misapplication source. Additionally, it may be desirable to intentionally create such an alternating phase shift, for example to trade-off the amplitudes of odd and even lobes.

Figure 9:
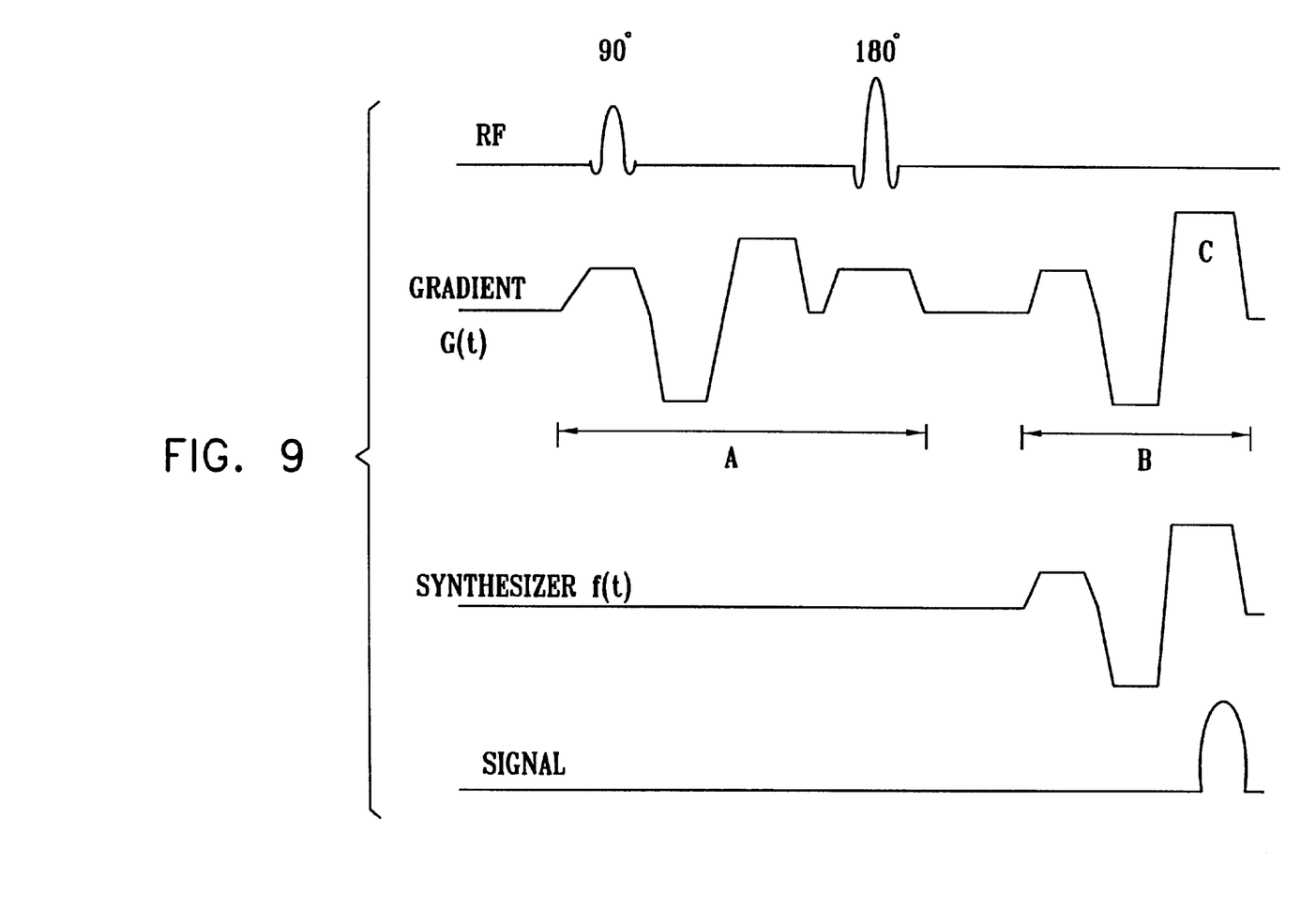
FIG. 9 illustrates a calibration sequence in accordance with a preferred embodiment of the invention.

In a preferred embodiment of the invention, the phase shift is determined using a calibration sequence, which measures the effective phase shift of one or more sub-pulses. FIG. 9 is an exemplary calibration scan which measures the phase shift between two sub-pulses. However, in other calibration sequences, an average over more sub-pulses may be used or other methods of determining the phase shifts, for example by measuring the transfer of amplitude between the magnetization lobes, may be used.

The calibration sequence of FIG. 9 is based on a spin-echo sequence and comprises a segment A and a segment B. Segment A is preferably a flow compensated spin echo sequence with 90 and 180 standard slice selection pulses. Segment B is also preferably flow compensated. The flow compensation is preferably provided to avoid artifacts caused by patient motion and/or by blood flow. The two gradient lobes in segment B prior to gradient C preferably act as "dummy" gradients (a larger number may be applied) to allow gradients to reach steady state behavior.

Gradient lobe C in segment B is preferably the same as used in the spectral-spatial pulse. Additional RF signals $f(t)$ are applied in conformance with gradient C, using the equation $f(t)=\gamma G(t)z_i+v_0$. This calibration (or pre-scan) sequence is applied twice, once with patterns $G(t)$ and $f(t)$ and one with $-G(t)$ and $-f(t)$. The signal phase is calculated for the two runs and then added together, preferably for each slice individually. The resulting phase value is the phase shift between a positive gradient sub-pulse and a negative gradient sub-pulse. This correction is applied by adding a phase to all the even subpulses relative to odd pulses by the resulting value or by subtracting a same phase from odd sub-pulses relative to even pulses. As indicated above, this correction may be applied in various ways, including changing the synthesizer phase between sub-pulses or adding a constant phase shift to one type of sub-pulse, relative to the synthesizer. In a preferred embodiment of the invention, this sequence is run for multiple slices to determine a correction for each slice. The above description assumes that the rise and fall effects are similar and that they are constant for all the sub-pulses. If this is not the case, each sub-pulse and/or rise or fall can be measured and corrected for separately.

The above description has centered on spectral-spatial pulses where the gradient was applied using a single coil, such as a $G_x$, $G_y$ or $G_z$ coil. In some cases, an oblique slice selection is required, using two or more gradient coils to effect the selection. In these oblique scans, the logical orthogonal axes $G'(t)=[G_s$ (gradient in the slice direction), $G_p$ (phase direction), $G_r$ (readout direction)$]^T$ are mapped onto the physical gradient axes $G(t)=[G_z,G_y,G_x]^T$ by a rotation matrix R, where $G'(t)=RG(t)$. If the gradient response of the three physical gradient channels (circuitry (filters)+coils+eddy currents) is not the same, an oblique rotation of the slice gradient $G_s$ will generate blips along $G_p$ and $G_r$ (in the plane of the slice) and a shift in the desired logical gradient $G_s$. These effects are described in "Referenceless Interleaved Echo Planar Imaging", by S. B. Reeder, et. al., in *Mag. Res. Med.* Vol. 41, pp. 87–94 (1999), the disclosure of which is incorporated herein by reference.

In a preferred embodiment of the invention, the blips along $G_p$ and $G_r$ are compensated for during pre-scanning and/or during spectral-spatial pulse application to avoid causing in plane phase errors.

In a preferred embodiment of the invention, equation (4) is expanded to include the terms for all the gradients:

$$\psi_z(t) = \gamma z_i \int_0^t \Delta G_z(t')dt' + \gamma \int_0^t \Delta B_{0z}(t')dt' \qquad (5)$$
$$= \Delta k_z(t)z_i + \phi_{0z}(t)$$

where the subscript z can be replaced by x or y for the appropriate gradients. The phase shift $\psi$ is composed of a position dependent component $\Delta k_i$ and a position independent component $\phi_{0i}(t)$ for (as used herein) $i=\{x, y, z\}$.

The phase error $\psi_i(t)$ for $i=\{x, y, z\}$ is preferably measured for $G_x$, $G_y$ and $G_z$, on a phantom using a multi-slice sequence. $\Delta k_i$ and $\phi_{0i}$ are preferably determined by fitting $\psi_i(t)$ vs. the slice position to a straight line, to separate out the position dependent and the position independent components. As described below, these measurements may be used (in conjunction with the rotation R) to determine the phase corrections along the oblique axes.

In a preferred embodiment of the invention, the amplitudes of gradient blips along $G_p$ and $G_r$ can be determined from the measured $\Delta k_i$ and the known rotation matrix R, using equations (8) and (9) in the Reeder paper. In a preferred embodiment of the invention, the blips are corrected by applying compensation blips of opposite amplitude along $G_p$ and $G_r$. In a preferred embodiment of the invention, these blips are scaled according to the desired slice width. Since the slice is thin, a small $G_s$ error, which adds a phase shift to the entire slice can destroy the image quality of the entire slice. The $G_r$ and $G_p$ effects are to add a linear phase in the slice plane, which usually affects the edges of the slice more than its center. Thus, $G_s$ is preferably measured using a pre-scan as described above with reference to FIG. 9, and $G_p$ and $G_r$ are preferably determined from measurements performed on a phantom (to save scan time).

Alternatively, the $G_s$ correction can be determined by calculation instead of by using a pre-scan. The linear phase correction along the logical slice direction, $\Delta k_i$, can be calculated using equation (7) of the Reeder paper. This correction can be applied via a transmitted phase correction, as described above, or using a $G_s$ compensating blip. A calculation rather than a pre-scan is preferred for fast scan sequences, such as realtime EPI and/or where there is no time to apply a pre-scan.

The position independent phase correction $\phi_{0s}$ is preferably determined by:

$$\phi_{0s} = R_{11}\phi_{0z} + R_{12}\phi_{0y} + R_{13}\phi_{0x} \qquad (6)$$

where $R_{ij}$ is the (i, j) element of the rotation matrix R and $\phi_{0i}$ is the position independent phase shift in equation (5). A similar equation can be used for the other logical gradient axes.

The above determinations are simplified by assuming the linearity of the gradient deviation $\Delta G_i$ vs. the gradient demand $G_i$. This assumption is implicit by assuming that the deviation $G_s$ is a linear combination of $\Delta G_i$ according to rotation matrix R and is scaleable according to the desired slice width. If this assumption is ignored, the above calculation process may be performed assuming a piece-wise linear relationship, with a plurality of correction values being stored for different gradient demands. Also, in some cases there is cross talk between the gradients, for example, $G_z$ causing a $G_y$ eddy current. These effects were ignored in the above analysis but can be corrected for in the same way.

In a preferred embodiment of the invention, a spectral-spatial pulse is designed using the following process:

0. Accept pulse parameters, usually, time-bandwidth and slicewidth.
1. Deciding whether to use selective saturation or selective excitation.
2. Selecting the type of FIR filter to use. In some cases, the specific choice is between a constant ripple minimum phase filter (preferred for saturation but also usable for excitation, especially if there is no refocusing) and a constant ripple linear phase filter (preferred for excitation).
3. Select a sub-pulse (sub-pulse duration, sub-pulse wave form (e.g., SLR or sinc)) based on the slice width, the time-bandwidth, and the available slew rates, to determine τ. In some cases, the input parameters may need to be adjusted to meet system limitations.
4. Determining N, the FIR bandwidth and the ripple parameters based on the frequency transition width and the type of pulse (water selective or fat selective).
5. Determining a required phase shift, to have a desired lobe translation effect and/or for correcting for known problems, for example as described above.
6. Determining a desirable synthesizer frequency, for example as described above.
7. Generating the pulse, for example using an inverse SLR transform.

Preferably, saturation pulses with a flip angle of >90° are used. Also, VERSE is preferably used so that also ramp-portions of the gradient can be utilized. The effect of the pulse is preferably simulated prior to its being used. When the pulse is used, it is preferably preceded by a calibration run to determine a phase shift correction, as described above. Alternatively or additionally, one, two or more dummy pulses are applied prior to the application of RF, to place eddy currents in a steady state.

The above discussion has been generally to fat saturation (or water excitation), however, it should be appreciated that the above methods of designing and applying type I and type II spectral-spatial pulses may be applied to other situations where frequency selective imaging and/or saturation is desired, for example, spectroscopy.

Attention is directed to a software appendix attached herewith and forming an integral portion of this specification. The appendix includes several MathLab 4 program files, useful for designing spectral-spatial pulses in accordance with preferred embodiments of the invention. In one example, a type I pulse can be created by executing the program "puconv.m". This generates the pulse by calling other routines. After manual review of the magnetization, a final full simulation is preferably done by running "typ1_2d.m". This generates a fill 2D graph of $-M_z$ (saturation pulse) or $M_{xy}$(excitation pulse). For a type II pulse the programs "puconv.m" and "typ2_2d.m" are used instead. The various pulse parameters are entered interactively during the program execution.

It will be appreciated that the above described methods of spectral-spatial pulse design may be varied in many ways, including, using the pulse for tree-dimensional imaging, using real or complex pulses and sub-pulses, changing the order of steps, which steps are performed off-line and which on-line and the order of steps. In addition, a multiplicity of various features, both of method and of devices have been described. It should be appreciated that different features may be combined in different ways. In particular, not all the features shown above in a particular embodiment are necessary in every similar preferred embodiment of the invention. Further, combinations of the above features are also considered to be within the scope of some preferred embodiments of the invention. Although the present invention has been described mainly as methods, apparatus for performing the methods, especially MRI equipment with suitable hardware and/or software are also within the scope of the invention. When used in the following claims, the terms "comprises", "comprising", "includes", "including" or the like mean "including but not limited to".

It will be appreciated by a person skilled in the art that the present invention is not limited by what has thus far been described. Rather, the scope of the present invention is limited only by the following claims.

What is claimed is:

1. A method of selective excitation of a first spectral band in the presence of a second spectral band whose magnetization vector is not to be affected, comprising:

selecting a central synthesizer frequency of substantially the second spectral band;

applying a spectral-spatial pulse, centered on the selected synthesizer frequency to selectively excite the first spectral band.

2. A method according to claim 1, wherein said spectral-spatial pulse comprises a type II spectral-spatial pulse having odd and even pulse trains.

3. A method according to claim 1, wherein said spectral-spatial pulse comprises a type I spectral-spatial pulse.

4. A method according to claim 2, wherein applying a pulse comprises adding a phase shift between said odd pulses and said even pulses to translate a magnetization lobe of said pulse.

5. A method according to claim 3, wherein translating said lobe causes said lobe to have a substantially zero magnetization amplitude at said synthesizer frequency.

6. A method according to claim 1, wherein said excitation adds a tip angle of over 90° to spins in said first spectral band.

7. A method according to claim 1, wherein said excitation adds a tip angle of under 40° to spins in said first spectral band.

8. A method according to claim 1, wherein said pulse is a selective excitation pulse.

9. A method according to claim 1, wherein said pulse is a selective saturation pulse.

10. A method according to claim 1, comprising acquiring data responsive to said excitation and generating a spatial image using said acquired data.

11. A method of affecting magnetization vectors in magnetic resonance, comprising:

providing a type II spectral-spatial pulse having odd and even magnetization lobes; and modifying at least one parameter of said pulse to independently control a characteristic of said odd lobes with respect to said even magnetization lobes, wherein said at least one parameters includes at least one relative phase shift of between at least two individual sub-pulses of said pulse, and wherein modifying comprises modifying said at least one parameter to reduce the amplitude of a particular magnetization lobe.

12. A method according to claim 11, wherein said characteristic comprises an amplitude of said lobes.

13. A method according to claim 11, wherein said at least one parameter comprises a phase shift between each pair of adjacent sub-pulses.

14. A method according to claim 13, wherein a same phase shift is added between said sub-pulses.

15. A method according to claim 13, wherein an alternating polarity phase shift is added between said sub-pulses.

16. A method according to claim 14, wherein said phase shift is approximately pi radians.

17. A method according to claim 14, wherein said phase shift is determined responsive to a ratio between a described spectral separation and an interval between sub-pulses in said pulse.

* * * * *